(12) United States Patent
Nishikawa

(10) Patent No.: US 7,365,588 B2
(45) Date of Patent: Apr. 29, 2008

(54) AUTOMATIC TIME CONSTANT ADJUSTMENT CIRCUIT

(75) Inventor: Koji Nishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 144 days.

(21) Appl. No.: 11/063,971

(22) Filed: Feb. 24, 2005

(65) Prior Publication Data

US 2005/0184786 A1    Aug. 25, 2005

(30) Foreign Application Priority Data

Feb. 25, 2004    (JP)    ............... 2004-049235

(51) Int. Cl.
G06F 7/64    (2006.01)
(52) U.S. Cl. ..................... 327/337; 327/344
(58) Field of Classification Search ........... 327/337, 327/344, 553, 554
See application file for complete search history.

(56) References Cited

U.S. PATENT DOCUMENTS 5,914,633 A * 6/1999 Comino et al. ............ 327/553
6,842,710 B1 * 1/2005 Gehring et al. ............ 702/107
6,891,414 B1 * 5/2005 Bunch et al. ............... 327/156

FOREIGN PATENT DOCUMENTS

| JP | 02-283115 | 11/1990 |
|----|-----------|---------|
| JP | 04-319810 | 11/1992 |
| JP | 07-321602 | 12/1995 |
| JP | 10-322162 | 12/1998 |

* cited by examiner

Primary Examiner—Kenneth B. Wells
(74) Attorney, Agent, or Firm—Arent Fox LLP (57) ABSTRACT

An automatic time constant adjustment circuit has an error detection circuit and a variable time constant circuit. The error detection circuit detects, based on the resistance of an error reference resistor and the capacitance of an error reference capacitor provided therein, a resistance/capacitance error resulting from a variation attributable to an IC process, and then outputs a control signal corresponding to the resistance/capacitance error. The variable time constant circuit includes a resistance portion, a capacitance portion, and a switch portion. The resistance portion is build with one or more resistors. The capacitance portion is build with one or more capacitors. The switch portion sets the time constant of the variable time constant circuit according to the resistance/capacitance error by connecting together one of the resistors of the resistor portion and one of the capacitors of the capacitor portion according to the control signal.

10 Claims, 6 Drawing Sheets

AUTOMATIC TIME CONSTANT ADJUSTMENT CIRCUIT

This nonprovisional application claims priority under 35 U.S.C. §119(a) on Patent Application No. 2004-049235 filed in Japan on Feb. 25, 2004, the entire contents of which are hereby incorporated by reference.

BACKGROUND OF THE INVENTION

1. Field of the Invention

The present invention relates to an automatic time constant adjustment circuit that finds application in circuits having a time constant, such as filter circuits and delay circuits. More particularly, the present invention relates to an automatic time constant adjustment circuit that automatically adjusts an error in the time constant produced by a resistor-capacitor serial circuit formed within an integrated circuit (hereinafter "IC").

2. Description of Related Art

In an IC, a resistor is formed typically by diffusing an impurity, and a capacitor is formed typically by forming a thin oxide film on a semiconductor substrate and then fitting a metal electrode thereon (such techniques by which resistors and capacitors are formed within an IC will hereinafter be referred to as IC processes). In these processes, a variation in the amount of diffused impurity, a variation in the thickness of the oxide film, and other factors produce large variations in the resistance of the resistor and in the capacitance of the capacitor.

Specifically, when a resistor and a capacitor are formed within an IC, the "product of the resistance of the actually formed resistor and the capacitance of the actually formed capacitor" typically differs by a maximum of about ±20% from the "product of the design value of the resistance and the design value of the capacitance." That is, a fabrication error of about ±20% arises in the product of the resistance and the capacitance. Here, the "design value of the resistance" denotes the ideal resistance of the resistor formed within the IC, in other words, the resistance that the resistor will have if the fabrication error is 0%. Likewise, the "design value of the capacitance" denotes the ideal capacitance of the capacitor formed within the IC, in other words, the capacitance that the capacitor will have if the fabrication error is 0%.

Consider a case where a first-order low-pass filter is built with a serial circuit composed of a resistor (of which the actual resistance is Ra) and a capacitor (of which the actual resistance is Ca), both formed within an IC. The time constant of the low-pass filter is given by Ra.Ca. Here, an error of about ±20% in the time constant from the design value thereof results in as large an error (i.e., of about ±20%) in the cut-off frequency $1/(2\pi Ca.Ra)$ of the low-pass filter from the design value thereof.

According to another conventionally proposed configuration, in a variable-time-constant circuit of which the time constant is controlled according to a setting voltage fed from outside, the error in the time constant resulting from the error in the product of a resistance and a capacitance is automatically adjusted so that the time constant is controlled uniquely according to the setting voltage irrespective of the presence or magnitude of resistance/capacitance errors. Examples of such techniques are disclosed in Japanese Patent Registered No. 2808195 (hereinafter, Patent Publication 1) and Japanese Patent Application Laid-Open No. H7-321602 (hereinafter, Patent Publication 2).

As described above, if a time constant contains an error of about ±20% from the design value thereof, the cut-off frequency of a first-order low-pass filter having such a time constant contains as large an error (i.e., of about ±20%), giving the low-pass filter filtering characteristics greatly different from those desired.

One way to prevent this is to adjust, before factory shipment, a variable resistor or the like provided outside the IC with a view to making the characteristics of the filter closer to those desired (i.e., making the time constant closer to the design value thereof). Disadvantageously, however, such adjustment is not only time- and labor-consuming, but also increases the production cost of the printed circuit board or device that incorporates the filter.

The conventional configurations disclosed in Patent Publications 1 and 2 mentioned above, indeed, permit automatic adjustment of the time constant, but requires, disadvantageously, the supply of a setting voltage from outside. Moreover, the variable-time-constant circuit receives, in the form of an analog voltage, and the error detected in the product between the resistance and the capacitance, and the time constant of the variable-time-constant circuit is adjusted according to this analog voltage. Disadvantageously, this complicates the overall circuit design encompassing the circuit that detects the error and the variable-time-constant circuit, leading to a larger circuit scale and higher power consumption.

SUMMARY OF THE INVENTION

In view of the conventionally experienced inconveniences described above, it is an object of the present invention to provide an automatic time constant adjustment circuit that, with a small-scale, low-current-consumption circuit design, permits automatic adjustment of an error in the time constant of a time constant circuit formed within an IC.

To achieve the above object, according to the present invention, an automatic time constant adjustment circuit is provided with: an error detection circuit including an error reference resistor and an error reference capacitor formed, each by an IC process, on the same semiconductor substrate, the error detection circuit detecting, based on the resistance of the error reference resistor and the capacitance of the error reference capacitor, a resistance/capacitance error resulting from a variation attributable to an IC process, the error detection circuit then outputting a control signal corresponding to the resistance/capacitance error; and a variable time constant circuit including a resistance portion, a capacitance portion, and a switch portion, the resistance portion being build with one or more resistors formed by an IC process on the semiconductor substrate, the capacitance portion being build with one or more capacitors formed by an IC process on the semiconductor substrate, the switch portion being connected between the resistor portion and the capacitor portion, the switch portion setting the time constant of the variable time constant circuit according to the resistance/capacitance error by connecting together one of the resistors of the resistor portion and one of the capacitors of the capacitor portion according to the control signal. Here, at least either the number of resistors provided as the resistors or the number of capacitors provided as the capacitors is two or more.

In this configuration, resistors of which the design resistances are appropriately set and capacitors of which the design capacitances are appropriately set are previously formed by IC processes on a semiconductor substrate. Then, according to the detected resistance/capacitance errors, an appropriate ones of the resistors and of the capacitors are connected together so as to adjust the time constant automatically (i.e., without the need for adjustment work that needs to be done outside the IC) and thereby to reduce the error in the time constant (i.e., to improve the accuracy). The variable time constant circuit has only to be provided with resistors and capacitors for producing the time constant and a switch for connecting them together. This contributes to a smaller circuit scale and lower current consumption.

In the above configuration, preferably, the design resistances of the resistors of the resistor portion and the design capacitances of the capacitors of the capacitor portion are determined and the switch portion connects together appropriate ones of the resistors of the resistor portion and of the capacitors of the capacitor portion such that the maximum error arising between the actually set time constant and a predetermined target value of the time constant is smaller than a particular maximum value of the resistance/capacitance error attributable to an IC process.

This makes the maximum error arising between the actually set time constant and the predetermined target value of the time constant smaller than the predetermined maximum value of the resistance/capacitance error attributable to the IC process, and thus helps to surely reduce the error in the time constant (i.e., to improve the accuracy).

In the above configuration, preferably, the error detection circuit passes a current inversely proportional to the resistance of the error reference resistor through the error reference capacitor for a predetermined period and compares the voltage appearing as a result across the error reference capacitor with a predetermined reference voltage so as to detect the resistance/capacitance error by finding in which of n steps (where n is a natural number equal to or greater than 2) the resistance/capacitance error lies. The error detection circuit then outputs the control signal corresponding to the step in which the resistance/capacitance error is found to lie. Here, the time constant of the variable time constant circuit can be set at one of n time constants according to in which of the n steps the resistance/capacitance error is found to lie.

The error detection circuit can detect the resistance/capacitance error simply by passing a current inversely proportional to the resistance of the error reference resistor through the error reference capacitor for a predetermined period and then comparing the voltage appearing as a result across the error reference capacitor with a predetermined reference voltage. Moreover, the error detection circuit then outputs the control signal corresponding to the resistance/capacitance error not in the form of an analog signal but in the form of one of n step voltages to the variable time constant circuit. This helps to greatly simplify the configuration of the error detection circuit, contributing to an even smaller circuit scale and even lower current consumption in the automatic time constant adjustment circuit. Moreover, since the time constant can be set at one of n different values, the automatic time constant adjustment circuit can be so configured as to suit the accuracy required in the time constant.

In the above configuration, preferably, n is a natural number equal to or greater than 3 and the reference voltage includes a plurality of reference voltages having different voltage levels. Here, the error detection circuit compares the voltage appearing across the error reference capacitor with each of the plurality of reference voltages to output the control signal.

This helps to further reduce the error in the time constant (i.e., to further improve the accuracy).

In the above configuration, preferably, the error detection circuit passes a current inversely proportional to the resistance of the error reference resistor through the error reference capacitor for a first predetermined period, . . . , and for a k-th predetermined period (where k is a natural number equal to or greater than 2) and compares the voltage appearing as a result across the error reference capacitor during each of those periods with a predetermined reference voltage so as to detect the resistance/capacitance error by finding in which of (k+1) steps the resistance/capacitance error lies. The error detection circuit then outputs the control signal corresponding to the step in which the resistance/capacitance error is found to lie. Here, the time constant of the variable time constant circuit can be set at one of (k+1) time constants according to in which of the (k+1) steps the resistance/capacitance error is found to lie.

This too helps to further reduce the error in the time constant (i.e., to further improve the accuracy).

In the above configuration, preferably, the error detection circuit passes a current inversely proportional to the resistance of the error reference resistor through the error reference capacitor for a predetermined period and compares the voltage appearing as a result across the error reference capacitor with a predetermined reference voltage so as to detect the resistance/capacitance error, which corresponds to the value obtained by subtracting from the product of the resistance of the error reference resistor and the capacitance of the error reference capacitance the product of the design resistance of the error reference resistor and the design capacitance of the error reference capacitor, by finding in which of n steps (where n is a natural number equal to or greater than 2) the resistance/capacitance error lies. The error detection circuit then outputs the control signal corresponding to the step in which the resistance/capacitance error is found to lie. Here, the time constant of the variable time constant circuit can be set at one of n time constants according to in which of the n steps the resistance/capacitance error is found to lie. Moreover, the switch portion sets the time constant by connecting together, when receiving a control signal corresponding to the resistance/capacitance error being positive, appropriate ones of the resistors of the resistor portion and of the capacitors of the capacitor portion such that the design value of the time constant is smaller than a predetermined target value of the time constant and connecting together, when receiving a control signal corresponding to the resistance/capacitance error being negative, appropriate ones of the resistors of the resistor portion and of the capacitors of the capacitor portion such that the design value of the time constant is greater than the predetermined target value of the time constant.

Specifically, when the resistance/capacitance error is positive (negative), the product of the resistance and capacitance of the resistor and capacitor formed by IC processes on the semiconductor substrate is found to be greater (smaller) than the design value of that product. Thus, when the resistance/capacitance error is positive (negative), those resistors and capacitors which are so designed as to make the designed value of the time constant smaller (greater) than the target value are connected together to adjust the time constant. This too helps to reduce the error in the time constant (i.e., to improve the accuracy).

As discussed above, according to the present invention, it is possible to realize an automatic time constant adjustment circuit that, with a small-scale, low-current-consumption circuit design, permits automatic adjustment of an error in the time constant of a time constant circuit formed within an IC.

DETAILED DESCRIPTION OF PREFERRED EMBODIMENTS

First Embodiment

Figure 1:
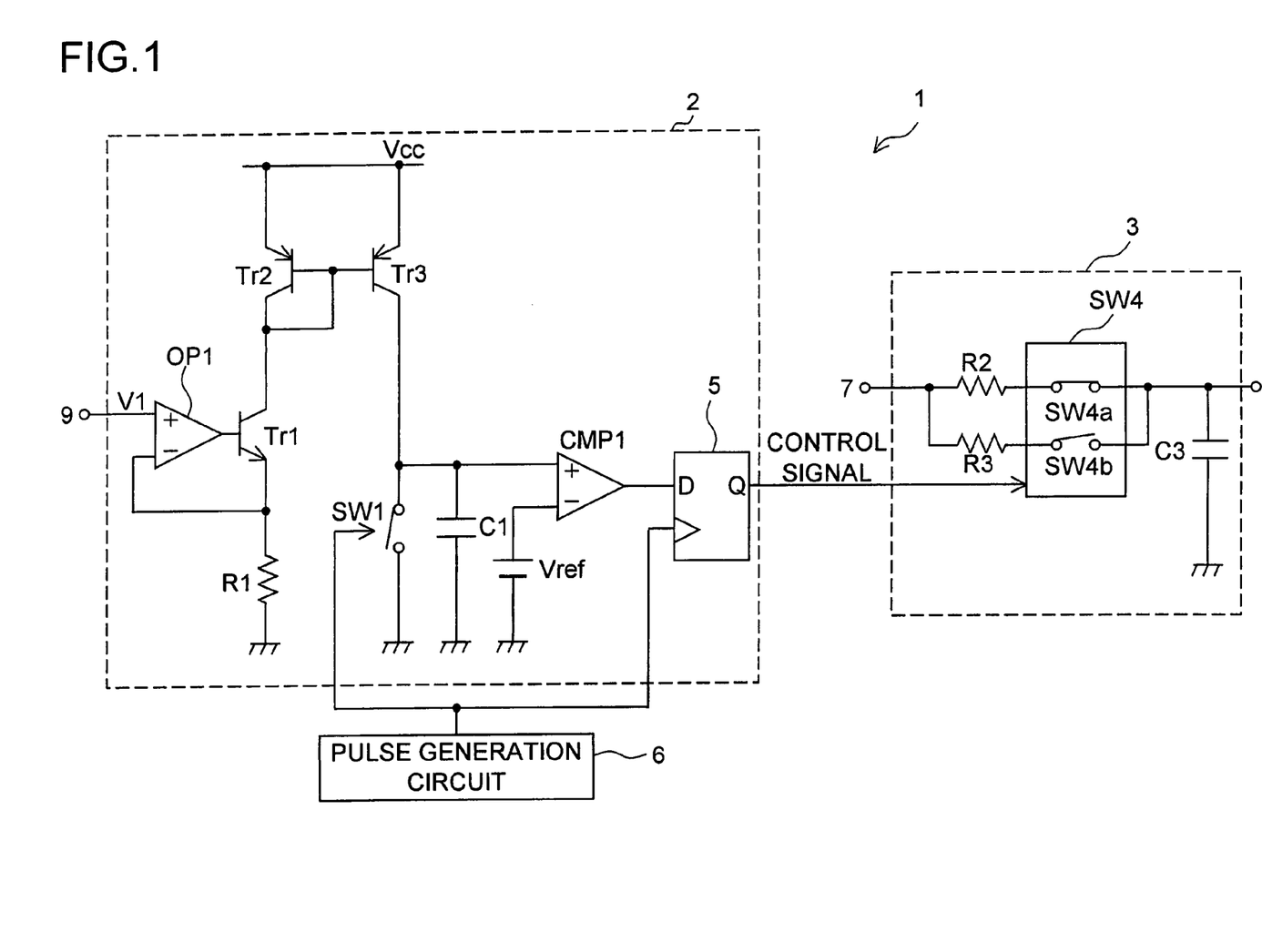
FIG. 1 is a circuit diagram of the automatic time constant adjustment circuit of a first embodiment of the invention.

The automatic time constant adjustment circuit of a first embodiment of the invention will be described below with reference to FIGS. 1 and 2. FIG. 1 is a circuit diagram showing the configuration of the automatic time constant adjustment circuit 1 of the first embodiment. The automatic time constant adjustment circuit 1 is composed of: an error detection circuit 2 that detects an resistance/capacitance error resulting from a variation attributable to an IC process, and that then outputs a control signal corresponding to the resistance/capacitance error; a variable time constant circuit 3 of which the time constant is variable; and a pulse generation circuit 6 that feeds a pulse voltage to the error detection circuit 2.

Here, a "resistance/capacitance error" denotes the value calculated, in a case where a resistor and a capacitor are formed by IC processes on a semiconductor substrate, by subtracting from the "product of the resistance and capacitance of the actually formed resistor and capacitor" the "product of the design resistance and capacitance of the resistor and capacitor." The value calculated by dividing the resistance/capacitance error by the "product of the design resistance and capacitance of the resistor and capacitor" usually amounts to about ±20% of the latter. As described earlier in connection with the conventional configurations, the product of the resistance and capacitance of the resistor and capacitor contains an error of about ±20% at the maximum.

Configuration of the Error Detection Circuit 2

First, the configuration of the error detection circuit 2 will be described. A supply voltage Vcc is fed to the emitters of PNP transistors Tr2 and Tr3, and the base and collector of the PNP transistor Tr2 and the base of the PNP transistor Tr3 are connected together. Thus, the PNP transistors Tr2 and Tr3 together form a current mirror circuit.

The collector of the PNP transistor Tr2 is also connected to the collector of an NPN transistor Tr1. The base of the NPN transistor Tr1 is connected to the output terminal of an operational amplifier OP1, and the emitter of the NPN transistor Tr1 is connected to the inverting input terminal (−) of the operational amplifier OP1 and also to one end of an error reference resistor R1. The other end of the error reference resistor R1 is grounded. A predetermined voltage V1 is fed in via a terminal 9, and is fed to the non-inverting input terminal (+) of the operational amplifier OP1.

One end of a switch SW1 is connected to the collector of the PNP transistor Tr3, to one end of an error reference capacitor C1, and also to the non-inverting input terminal (+) of a comparator CMP1. The other end of the switch SW1 is grounded. The other end of the error reference capacitor C1 is grounded. A predetermined reference voltage Vref is applied to the inverting input terminal (−) of the comparator CMP1.

The output voltage of the comparator CMP1 is fed to the D terminal of a D flip-flop 5, and a pulse voltage (of which the period of a single pulse equals twice a length of time T, and of which the duty factor is 50%) from the pulse generation circuit 6 is fed to the clock terminal of the D flip-flop 5. The voltage outputted from the Q terminal of the D flip-flop 5 is fed, as the control signal outputted from the error detection circuit 2, to the variable time constant circuit 3. The D flip-flop 5 is of the positive edge trigger type; that is, when the voltage fed to the clock terminal thereof turns low to high, the D flip-flop 5 latches the voltage fed to the D terminal thereof and delivers this voltage, as it is, to the Q terminal thereof.

The pulse voltage outputted from the pulse generation circuit 6 is also fed, as a control voltage for turning the switch SW1 on and off, to the switch SW1. When the control voltage is high, the switch SW1 is on; when the control voltage is low, the switch SW1 is off (FIG. 1 shows the state in which the switch SW1 is off).

Next, the operation of the error detection circuit 2 will be described. Let the "design resistance of the error reference resistor R1" and the "design capacitance of the error reference capacitor C1" be Rref and Cref, respectively, and let the "actual resistance of the error reference resistor R1" and the "actual capacitance of the error reference capacitor C1" be Rreal and Creal, respectively. Then, the resistance/capacitance error is expressed as Rreal·Creal−Rref·Cref.

Since the voltage fed to the non-inverting input terminal (+) of the operational amplifier OP1 is V1, the current that flows through the error reference resistor R1 when the operational amplifier OP1 and the NPN transistor Tr1 are operating is V1/Rreal. Since the PNP transistors Tr2 and Tr3 form a current mirror circuit, the current that flows from the emitter of the PNP transistor Tr3 to the collector thereof is equal to the current that flows through the error reference resistor R1, namely V1/Rreal.

Consider what happens when the switch SW1 turns from on to off (i.e., when the pulse voltage outputted from the pulse generation circuit 6 turns from high to low). Whereas, with the switch SW1 on, the voltage across the error reference capacitor C1 is 0 V, the moment that the switch SW1 turns on to off, the current V1/Rreal starts to flow into the error reference capacitor C1.

Thus, when a length of time T has elapsed after the switch SW1 turned from on to off (i.e., when the voltage outputted from the pulse generation circuit 6 turns from low to high), the voltage, call it Vc, across the error reference capacitor C1 immediately before the switch SW1 turns on fulfills formula (1) below.

$$Vc = V1 \cdot T / (Rreal \cdot Creal) \tag{1}$$

Here, the reference voltage Vref, the voltage V1, and the length of time T are so determined as to fulfill formula (2) below.

$$Vref = V1 \cdot T / (Rref \cdot Cref) \tag{2}$$

Thus, when Rreal·Creal>Rref·Cref holds (i.e., when the resistance/capacitance error is positive), Vc is smaller than Vref. Hence, the output that the comparator CMP1 yields when the pulse voltage outputted from the pulse generation circuit 6 turns from low to high is low. By contrast, when Rreal·Creal<Rref·Cref holds (i.e., when the resistance/capacitance error is negative), Vc is greater than Vref. Hence, the output that the comparator CMP1 yields when the pulse voltage outputted from the pulse generation circuit 6 turns from low to high is high.

The output voltage that the comparator CMP1 yields when the pulse voltage outputted from the pulse generation circuit 6 turns from low to high is then latched by the D flip-flop 5, and is fed, as the control signal from the error detection circuit 2, to the variable time constant circuit 3.

Put otherwise, what is performed by the error detection circuit 2 is as follows. A current V1/Rreal that is inversely proportional to the resistance Rreal of the error reference resistor R1 is passed through the error reference capacitor C1 (i.e., the error reference capacitor C1 is charged or discharged) for a predetermined length of time T, and the voltage Vc that appears as a result across the error reference capacitor C1 is compared with a predetermined reference voltage Vref. In this way, the resistance/capacitance error resulting from a variation attributable to IC processes is detected by finding in which of two steps, namely positive and negative, it lies. Then, according to whether the resistance/capacitance error is positive or negative, a low or high level, respectively, is fed, as a control signal from the error detection circuit 2, to the variable time constant circuit 3.

Configuration of the Variable Time Constant Circuit 3

Next, the configuration of the variable time constant circuit 3 will be described (see FIG. 1). A terminal 7 is connected to one end of a resistor R2 and also to one end of a resistor R3. The other end of the resistor R3 is connected through a switch SW4a to a terminal 8, and the other end of the resistor R2 is connected through a switch SW4b to the terminal 8. The switches SW4a and SW4b together form a switch circuit SW4. The switch circuit SW4 is controlled by a control signal from the error detection circuit 2 in such a way that, according to the control signal, one of the switches SW4a and SW4b selectively turns on.

Figure 3:
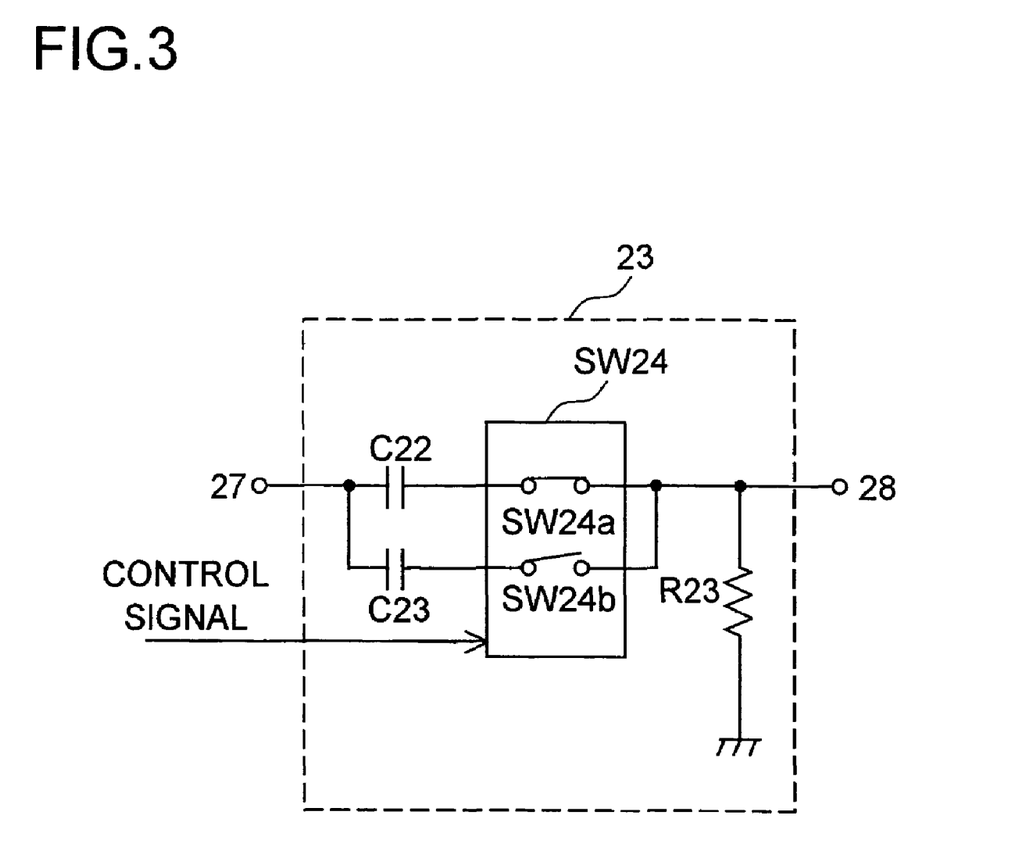
FIG. 3 is part of a circuit diagram of the automatic time constant adjustment circuit of a second embodiment of the invention.

Specifically, when the control signal is high, the switch SW4a turns off and the switch SW4b turns on; when the control signal is low, the switch SW4a turns on and the switch SW4b turns off (FIG. 3 shows the state in which the control signal is low).

The terminal 8 is also grounded through a capacitor C3. The variable time constant circuit 3 forms a first-order low-pass filter (hereinafter "LPF") that receives an input via the terminal 7 and yields an output via the terminal 8. The time constant of this LPF is variable (i.e., one of two different time constants can be set) according to the control signal from the error detection circuit 2 (i.e., according to the resistance/capacitance error).

Let the "target value of the time constant" of the first-order LPF (i.e., the ideal value of the time constant of the LPF) formed by the variable time constant circuit 3 be Rfil·Cfil. First, consider the following case. The resistor R2 is designed to have a "design resistance" Rfil, and the capacitor C3 is designed to have a "design capacitance" Cfil. The resistor R2 and the capacitor C3 are formed by IC processes on the same semiconductor substrate, and they are then connected together to form a first-order LPF. In this case, as described earlier, the time constant contains an error of about ±20% at the maximum, and accordingly the cut-off frequency of the first-order LPF contains an error of about ±20% at the maximum. This is because the IC processes produce large absolute errors in the resistance and capacitance of the resistor and capacitor.

In contrast to the absolute errors (about 20% at the maximum) mentioned above, relative errors among the resistances and capacitances of resistors and capacitors formed by IC processes on the same semiconductor substrate are far smaller (for example, about 3%). That is, among a plurality of resistors formed on a single semiconductor substrate, the variations in the resistances thereof are approximately in the same direction (all the resistances vary to either the higher or lower side) and in the same rate, and, among a plurality of capacitors formed on a single semiconductor substrate, the variations in the capacitances thereof are approximately in the same direction (all the capacitances vary either to the higher or lower side) and in the same rate. This is exploited in the design of the variable time constant circuit 3.

Thus, next, consider the following case. Let the "design resistances" of the resistors R2 and R3 be 0.9·Rfil and 1.1·Rfil, respectively, and let the "design capacitance" of the capacitor C3 be Cfil. With the "design resistances" and the "design capacitance" set in this way, the maximum error of the time constant of the variable time constant circuit 3 is found in the following manner. In the following description, for the sake of simplicity, it is assumed that absolute errors of 20% (−20% to +20%) are involved but that no relative errors (0%) are involved.

Here, it should be noted that, when the resistor R2 and the capacitor C3 are connected together, the design value of the time constant (0.9·Rfil·Cfil) is smaller than the target value (Rfil·Cfil) of the time constant, and that, when the resistor R3 and the capacitor C3 are connected together, the design value of the time constant (1.1·Rfil·Cfil) is greater than the target value (Rfil·Cfil) of the time constant.

When the resistance/capacitance error detected by the error detection circuit 2 is positive, Rreal·Creal>Rref·Cref holds. This indicates that the product of the actual resistance and capacitance of the resistor and capacitor is greater than the design value of that product. That is, it is found that the product of the resistance and capacitance of a resistor and a capacitor formed by IC processes on the same semiconductor substrate contains a fabrication error of 0% to +20%.

In this case, the resistor R2 and the capacitor C3 form a first-order LPF (because the switch SW4a is on and the switch SW4b is off), and the design value of the time constant thereof (i.e., the time constant that will be obtained with a 0% fabrication error) is 0.9·Rfil·Cfil. Thus, when a fabrication error of 0% to +20% is allowed for, the actual time constant, call it T, fulfills formula (3) below (because 1.2 times 0.9 equals 1.08).

$$0.9 \cdot Rfil \cdot Cfil < \tau < 1.08 \cdot Rfil \cdot Cfil \qquad (3)$$

By contrast, when the resistance/capacitance error detected by the error detection circuit 2 is negative, Rreal·Creal<Rref·Cref holds. This indicates that the product of the actual resistance and capacitance of the resistor and capacitor is smaller than the design value of that product. That is, it is found that the product of the resistance and capacitance of a resistor and a capacitor formed by IC processes on the same semiconductor substrate contains a fabrication error of −20% to 0%.

In this case, the resistor R3 and the capacitor C3 form a first-order LPF (because the switch SW4a is off and the switch SW4b is on), and the design value of the time constant thereof (i.e., the time constant that will be obtained with a 0% fabrication error) is 1.1·Rfil·Cfil. Thus, when a fabrication error of −20% to 0% is allowed for, the actual time constant τ fulfills formula (4) below (because 0.8 times 1.1 equals 0.88).

$$0.88 \cdot Rfil \cdot Cfil < \tau < 1.1 \cdot Rfil \cdot Cfil \quad (4)$$

As will be understood from formulae (3) and (4), the actual time constant τ falls within the range of 0.88 to 1.1 times Rfil·Cfil, i.e., the "target value of the time constant." Thus, the maximum error of the time constant is reduced from 20% to about 10% (i.e., the accuracy of the time constant is improved).

In FIG. 1, the error reference resistor R1, the resistors R2 and R3, the error reference capacitor C1, and the capacitor C3 are formed by IC processes on the same semiconductor substrate. On the other hand, any other circuit elements used in the automatic time constant adjustment circuit 1 (namely, the operational amplifier OP1, the comparator CMP1, etc.) may or may not be formed by IC processes on the same semiconductor substrate on which the error reference capacitor C1 and the like are formed.

Modified Configuration of Error Detection Circuit 2

Now, the configuration of another error detection circuit 12, which is a modified version of the error detection circuit 2 shown in FIG. 1 will be described. Here, such circuit elements and signals as are found also in FIG. 1 are identified with common reference numerals and symbols, and their explanations will not be repeated.

A supply voltage Vcc is fed to one end of an error reference resistor R11, of which the other end is connected to the emitter of a PNP transistor Tr11 and to the inverting input terminal (−) of an operational amplifier OP11. The non-inverting input terminal (+) of the operational amplifier OP11 is connected to a terminal 19, to which a voltage (Vcc−V1) is applied. The output of the operational amplifier OP11 is fed to the base of the PNP transistor Tr11. The collector of the PNP transistor Tr11 is connected to the collector and base of an NPN transistor Tr12 and to the base of an NPN transistor Tr13. The emitters of the NPN transistors Tr12 and Tr13 are both grounded. The NPN transistors Tr12 and Tr13 together form a current mirror circuit.

The collector of the NPN transistor Tr13 is connected to one end of a switch SW11, to one end of an error reference capacitor C11, and to the inverting input terminal (−) of a comparator CMP11. The supply voltage Vcc is applied to the other end of the switch SW11 and to the other end of the error reference capacitor C11. A voltage obtained by subtracting a reference voltage Vref from the supply voltage Vcc is applied to the non-inverting input terminal (+) of the comparator CMP11, and the output terminal of the comparator CMP11 is connected to the D terminal of a D flip-flop 5.

The voltage outputted from the pulse generation circuit 6 is fed to the clock terminal of the D flip-flop 5 and also, as a control voltage for turning the switch SW11 on and off, to the switch SW1. When the control voltage is high, the switch SW11 is on; when the control voltage is low, the switch SW11 is off (FIG. 2 shows the state in which the switch SW11 is off).

In the error detection circuit 12 configured as described above, let the voltage appearing across the error reference capacitor C11 be Vc, and let the "design resistance of the error reference resistor R11," the "design capacitance of the error reference capacitor C11," the "actual resistance of the error reference resistor R11," and the "actual capacitance of the error reference capacitor C11" be Rref, Cref, Rreal, and Creal, respectively. Then, the error detection circuit 12 outputs a control signal similar to that outputted from the error detection circuit 2 shown in FIG. 1.

Figure 2:
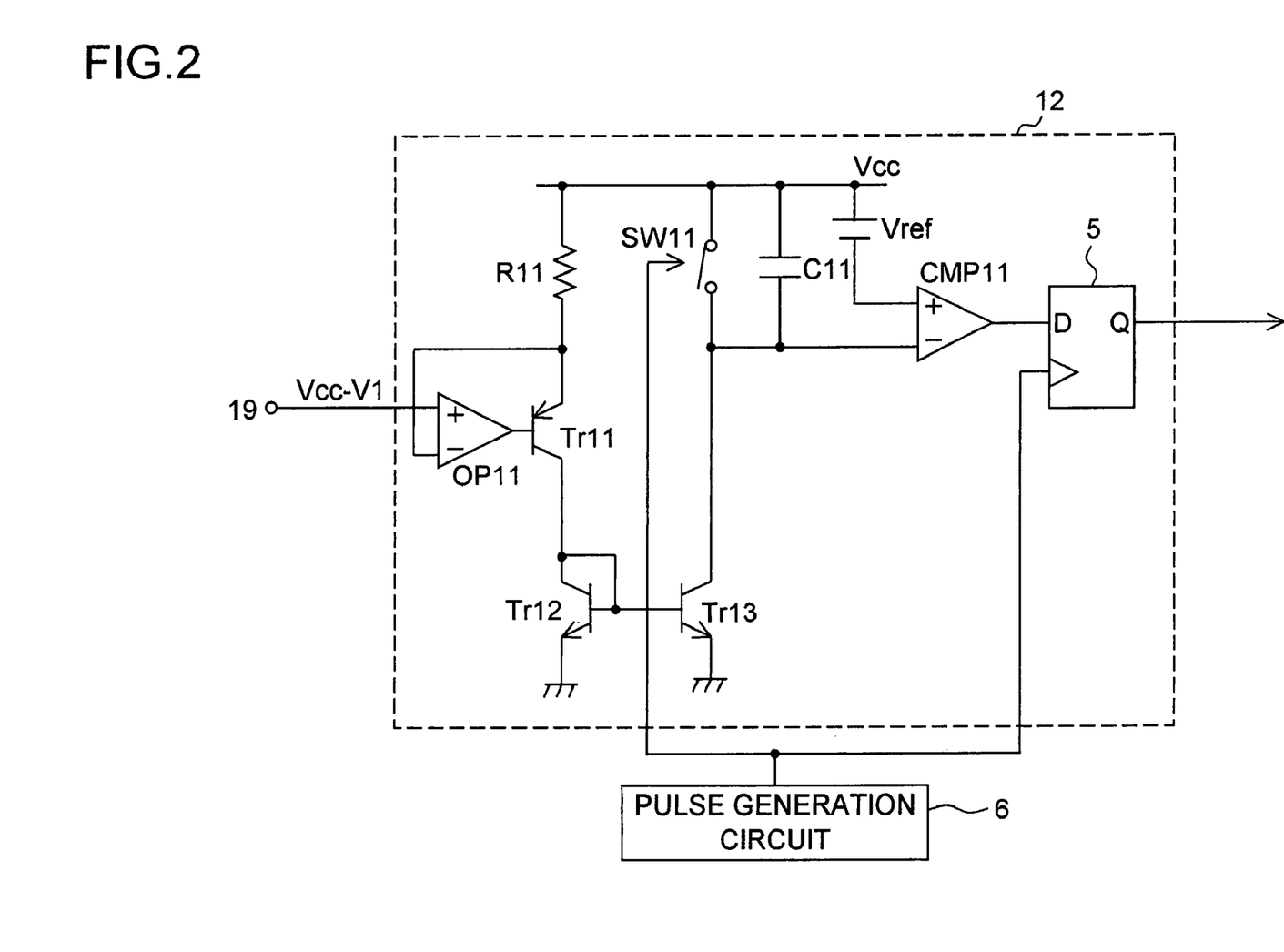
FIG. 2 is a diagram of a modified version of the automatic time constant adjustment circuit of the first embodiment of the invention.

As described above, the current that flows through the error reference resistor R1 or R11 in the error detection circuit shown in FIG. 1 or 2 (the error detection circuit 2 or 12) can be made dependent only on the voltage V1 and the resistance of the error reference resistor R1 or R11. Thus, one end of the error reference resistor R1 or R11 does not necessarily have to be grounded, nor does it have to be connected to the supply voltage.

The current mirror circuit formed by the PNP transistors Tr2 and Tr3 may be configured in any other manner than specifically shown in FIG. 1, so long as it so operates that, when the switch SW1 is off, the current that flows through the error reference capacitor C1 is kept equal to the current that flows through the error reference resistor R1. Likewise, the current mirror circuit formed by the NPN transistors Tr12 and Tr13 may be configured in any other manner than specifically shown in FIG. 2, so long as it so operates that, when the switch SW21 is off, the current that flows through the error reference capacitor C11 is kept equal to the current that flows through the error reference resistor R11. The NPN transistor Tr1 or the PNP transistor Tr11 may be replaced with a field-effect transistor.

The error reference resistor R11 and the error reference capacitor C11 are, along with the resistors R2 and R3 and the capacitor C3 of the variable time constant circuit 3 shown in FIG. 1, formed by IC processes on the same semiconductor substrate. On the other hand, any other circuit elements used in the error detection circuit 12 and the variable time constant circuit 3 (namely, the operational amplifier OP11, the comparator CMP11, etc.) may or may not be formed by IC processes on the same semiconductor substrate on which the error reference capacitor C11 and the like are formed.

Second Embodiment

Next, the automatic time constant adjustment circuit of a second embodiment of the invention will be described below with reference to FIG. 3. FIG. 3 shows, out of the overall circuit configuration of the automatic time constant adjustment circuit of the second embodiment, the part that constitutes a variable time constant circuit 23. In the second embodiment, the error detection circuit (the error detection circuit 2 or 12) and the pulse generation circuit 6 are configured in the same manner as in the first embodiment, and therefore these are not shown in FIG. 3 nor described any further below. The following description of the second embodiment assumes the use of the error detection circuit 2 (see FIG. 1) in combination with the variable time constant circuit 23, but it is of course possible to use instead the error detection circuit 12 (see FIG. 2) in combination with the variable time constant circuit 23.

A terminal 27 is connected to one end of a capacitor C22 and also to one end of a capacitor C23. The other end of the capacitor C22 is connected through a switch SW24a to a terminal 28, and the other end of the capacitor C23 is connected through a switch SW24b to the terminal 28. The switches SW24a and SW24b together constitute a switch circuit SW24. The switch circuit SW24 is controlled by a control signal from the error detection circuit 2 in such a way that, according to the control signal, one of the switches SW24a and SW24b selectively turns on.

Specifically, when the control signal is high, the switch SW24a turns off and the switch SW24b turns on; when the control signal is low, the switch SW24a turns on and the switch SW24b turns off (FIG. 3 shows the state in which the control signal is low).

The terminal 28 is also grounded through a resistor R23. The variable time constant circuit 23 forms a first-order high-pass filter (hereinafter "HPF") that receives an input via the terminal 27 and yields an output via the terminal 28. The time constant of this HPF is variable according to the control signal from the error detection circuit 2 (i.e., according to the resistance/capacitance error).

Let the "target value of the time constant" of the first-order HPF formed by the variable time constant circuit 23 be Rfil·Cfil. Moreover, let the "design capacitances" of the capacitors C22 and C23 be 0.9·Cfil and 1.1·Cfil, respectively, and let the "design resistance" of the resistor R23 be Rfil. With the "design capacitances" and the "design resistance" set in this way, the maximum error of the time constant of the variable time constant circuit 23 is found in the following manner. In the following description, for the sake of simplicity, it is assumed that absolute errors of 20% (−20% to +20%) are involved but that no relative errors (0%) are involved.

When the resistance/capacitance error detected by the error detection circuit 2 is positive, Rreal·Creal>Rref·Cref holds. This indicates that the product of the actual resistance and capacitance of the resistor and capacitor is greater than the design value of that product. That is, it is found that the product of the resistance and capacitance of a resistor and a capacitor formed by IC processes on the same semiconductor substrate contains a fabrication error of 0% to +20%.

In this case, the capacitor C22 and the resistor R23 form a first-order HPF (because the switch SW24a is on and the switch SW24b is off), and the design value of the time constant thereof (i.e., the time constant that will be obtained with a 0% fabrication error) is 0.9·Rfil·Cfil. Thus, when a fabrication error of 0% to +20% is allowed for, the actual time constant, call it τ, fulfills formula (3) noted earlier (because 1.2 times 0.9 equals 1.08).

By contrast, when the resistance/capacitance error detected by the error detection circuit 2 is negative, Rreal·Creal<Rref·Cref holds. This indicates that the product of the actual resistance and capacitance of the resistor and capacitor is smaller than the design value of that product. That is, it is found that the product of the resistance and capacitance of a resistor and a capacitor formed by IC processes on the same semiconductor substrate contains a fabrication error of −20% to 0%.

In this case, the capacitor C23 and the resistor R23 form a first-order HPF (because the switch SW24a is off and the switch SW24b is on), and the design value of the time constant thereof (i.e., the time constant that will be obtained with a 0% fabrication error) is 1.1·Rfil·Cfil. Thus, when a fabrication error of −20% to 0% is allowed for, the actual time constant τ fulfills formula (4) noted earlier (because 0.8 times 1.1 equals 0.88).

As will be understood from formulae (3) and (4), the actual time constant τ falls within the range of 0.88 to 1.1 times Rfil·Cfil, i.e., the "target value of the time constant." Thus, the maximum error of the time constant is reduced from 20% to about 10% (i.e., the accuracy of the time constant is improved).

In the second embodiment, as in the first embodiment, the error reference resistor R1, the error reference capacitor C1, the resistor R23, and the capacitors C22 and C23 are formed by IC processes on the same semiconductor substrate. On the other hand, any other circuit elements used in the automatic time constant adjustment circuit in the second embodiment (namely, the operational amplifier OP1, the comparator CMP1, etc.) may or may not be formed by IC processes on the same semiconductor substrate on which the error reference capacitor C1 and the like are formed.

Third Embodiment

Figure 4:
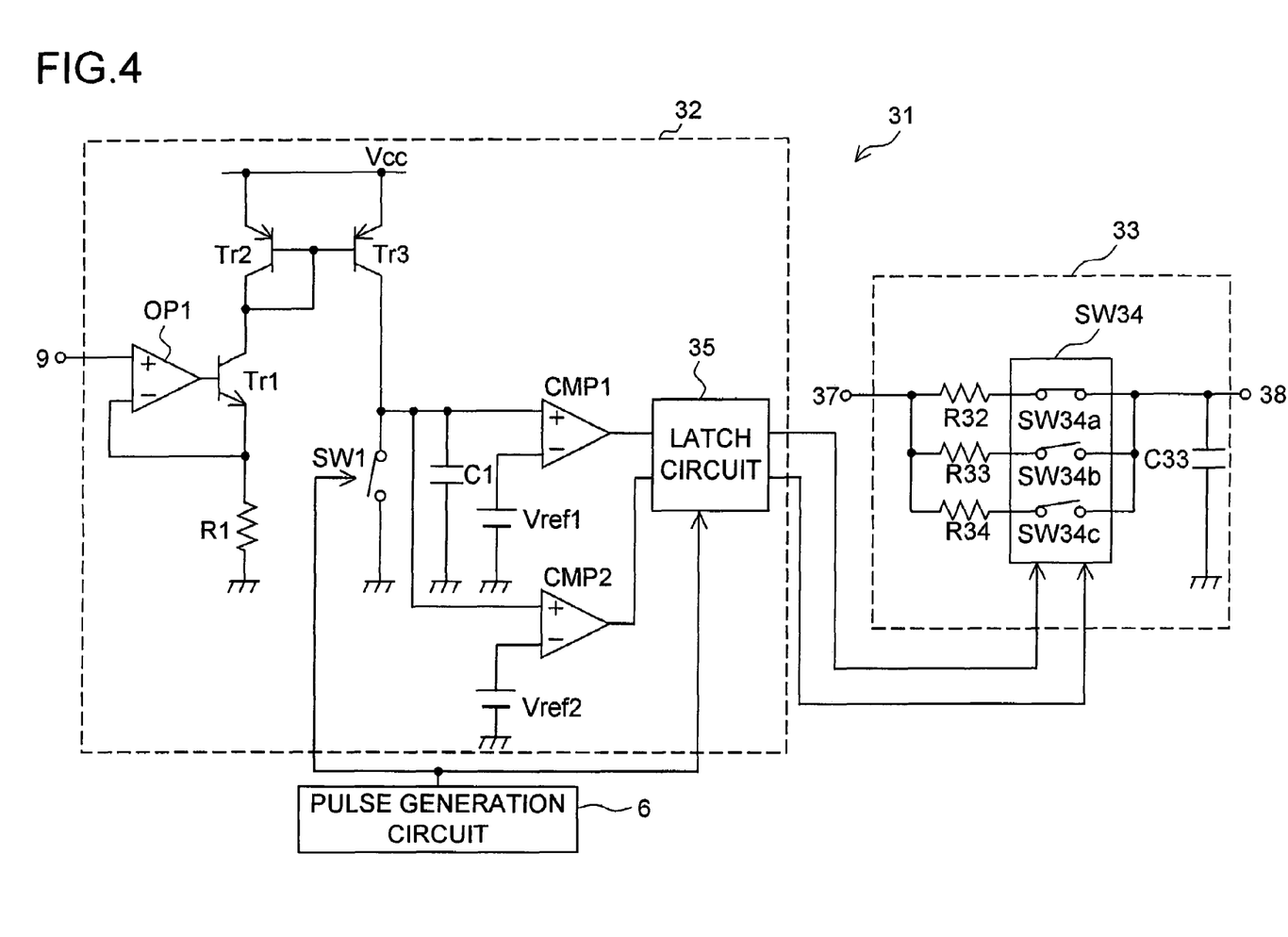
FIG. 4 is a circuit diagram of the automatic time constant adjustment circuit of a third embodiment of the invention.

Next, the automatic time constant adjustment circuit of a third embodiment of the invention will be described with reference to FIG. 4. FIG. 4 is a circuit diagram showing the configuration of the automatic time constant adjustment circuit 31 of the third embodiment. In FIG. 4, such circuit elements and signals as find their counterparts in FIG. 1 are identified with common reference numerals and symbols, and their explanations will not be repeated.

Configuration of the Error Detection Circuit 32

The error detection circuit 32 shown in FIG. 4 differs from the error detection circuit 2 shown in FIG. 1 in the following respects. The non-inverting input terminal (+) of a comparator CMP2, which receives a reference voltage Vref2 at the inverting input terminal (−) thereof, is connected to the non-inverting input terminal (+) of the comparator CMP1. The voltage fed to the inverting input terminal (−) of the comparator CMP1 is a reference voltage Vref1. Instead of the D flip-flop 5 shown in FIG. 1, a latch circuit 35 is provided, which is fed with the output voltages of the comparators CMP1 and CMP2 and with the pulse voltage outputted from the pulse generation circuit 6. The control signal outputted from the error detection circuit 32, which corresponds to the control signal outputted from the error detection circuit 2 shown in FIG. 1, is outputted from the latch circuit 35. In other respects, the error detection circuit 32 is the same as the error detection circuit 2 shown in FIG. 1.

The latch circuit 35 latches, as they are, the outputs that the comparators CMP1 and CMP2 yield when the pulse voltage outputted from the pulse generation circuit 6 turns from low to high (i.e., immediately before the switch SW1 turns on), and feeds those voltages, the output voltage of the comparator CMP1 as a control signal A and the output voltage of the comparator CMP2 as a control signal B, to a switch circuit 34, which will be described later. These control signals A and B serve as the "control signal" outputted from the error detection circuit 32.

First, consider the path by way of which a current V1/Rreal flows into the error reference capacitor C1. This path is the same as in FIG. 1. Thus, formula (1) noted earlier holds. Here, the reference voltages Vref1 and Vref2, the voltage V1, and the length of time T are so determined as to fulfill formulae (5) and (6) below.

$$Vref1 = V1 \cdot T/(Rref \cdot Cref \cdot 0.93) \quad (5)$$

$$Vref2 = V1 \cdot T/(Rref \cdot Cref \cdot 1.07) \quad (6)$$

Hence, (i) when Vref2>Vc, i.e., when Rreal·Creal>Rref·Cref·1.07 holds, the outputs that the comparators CMP1 and CMP2 yield when the pulse voltage outputted from the pulse generation circuit 6 turns from low to high are both low. Thus, the latch circuit 35 so operates as to make both the control signals A and B low.

(ii) When Vref2<Vc<Vref1, i.e., when Rref·Cref·0.93<Rreal·Creal<Rref·Cref·1.07 holds, the outputs that the comparators CMP1 and CMP2 yield when the pulse voltage outputted from the pulse generation circuit 6 turns from low to high are low and high, respectively. Thus, the latch circuit 35 so operates as to make the control signals A and B low and high, respectively.

(iii) When Vc>Vref1, i.e., when Rreal·Creal<Rref·Cref·0.93 holds, the outputs that the comparators CMP1 and CMP2 yield when the pulse voltage outputted from the pulse generation circuit 6 turns from low to high are both high. Thus, the latch circuit 35 so operates as to make both the control signals A and B high.

In this way, the error detection circuit 32 detects the resistance/capacitance error by finding in which of three steps it lies, and then outputs a control signal corresponding to the thus found step to a variable time constant circuit 33.

Configuration of the Variable Time Constant Circuit 33

Next, the configuration of the variable time constant circuit 33 shown in FIG. 4 will be described. A terminal 37 is connected to one end of each of resistors R32, R33, and R34. The other end of the resistor R32 is connected through a switch SW34a to a terminal 38, the other end of the resistor R33 is connected through a switch SW34b to the terminal 38, and the other end of the resistor R34 is connected through a switch SW34c to the terminal 38. The switches SW34a, SW34b, and SW34b together constitute a switch circuit SW34. The switch circuit SW34 is controlled by a control signal from the error detection circuit 32 in such a way that, according to the control signal, one of the switches SW34a, SW34b, and SW34b selectively turns on.

Specifically,
(i) when the controls signals A and B are both low, the SW34a, SW34b, and SW34c are on, off, and off, respectively;
(ii) when the controls signals A and B are low and high, respectively, the SW34a, SW34b, and SW34c are off, on, and off, respectively; and
(iii) when the controls signals A and B are both high, the SW34a, SW34b, and SW34c are off, off, and on, respectively.

The terminal 38 is also grounded through a capacitor C33. The variable time constant circuit 33 forms a first-order low-pass filter (LPF) that receives an input via the terminal 37 and yields an output via the terminal 38. The time constant of this LPF is variable (i.e., one of three different time constants can be set) according to the control signals from the error detection circuit 32 (i.e., according to the resistance/capacitance error).

Let the "target value of the time constant" of the first-order LPF formed by the variable time constant circuit 33 be Rfil·Cfil. Moreover, let the "design resistances" of the resistors R32, R33, and R34 be 0.87·Rfil, Rfil, and 1.15·Rfil, respectively, and let the "design capacitance" of the capacitor C33 be Cfil. With the "design capacitance" and the "design resistances" set in this way, the maximum error of the time constant of the variable time constant circuit 33 is found in the following manner. In the following description, for the sake of simplicity, it is assumed that absolute errors of 20% (−20% to +20%) are involved but that no relative errors (0%) are involved.

(i) When the control signals A and B are both low, on the basis of formula (6) noted above, it is found that the product of the resistance and capacitance of a resistor and a capacitor formed by IC processes on a single semiconductor substrate contains a fabrication error of +7% to +20%. In this case, the resistor R32 and the capacitor C33 form a first-order LPF, and the design value of the time constant thereof (i.e., the time constant that will be obtained with a 0% fabrication error) is 0.87·Rfil·Cfil. Thus, when a fabrication error of +7% to +20% is allowed for, the actual time constant, call it τ, fulfills formula (7) below (because 1.07 times 0.87 equals 0.9309 and 1.2 times 0.87 equals 1.044).

$$0.9309 \cdot Rfil \cdot Cfil < \tau < 1.044 \cdot Rfil \cdot Cfil \quad (7)$$

(ii) When the control signals A and B are low and high, respectively, on the basis of formulae (5) and (6) noted above, it is found that the product of the resistance and capacitance of a resistor and a capacitor formed by IC processes on a single semiconductor substrate contains a fabrication error of −7% to +7% (because 0.93−1=−0.07). In this case, the resistor R33 and the capacitor C33 form a first-order LPF, and the design value of the time constant thereof (i.e., the time constant that will be obtained with a 0% fabrication error) is Rfil·Cfil. Thus, when a fabrication error of −7% to +7% is allowed for, the actual time constant τ fulfills formula (8) below.

$$0.93 \cdot Rfil \cdot Cfil < \tau < 1.07 \cdot Rfil \cdot Cfil \quad (8)$$

(iii) When the control signals A and B are both high, on the basis of formula (5) noted above, it is found that the product of the resistance and capacitance of a resistor and a capacitor formed by IC processes on a single semiconductor substrate contains a fabrication error of −20% to −7% (because 0.93−1=−0.07). In this case, the resistor R34 and the capacitor C33 form a first-order LPF, and the design value of the time constant thereof (i.e., the time constant that will be obtained with a 0% fabrication error) is 1.15·Rfil·Cfil. Thus, when a fabrication error of −20% to −7% is allowed for, the actual time constant τ fulfills formula (9) below (because 1.15 times 0.8 equals 0.92 and 1.15 times 0.93 equals 1.0695).

$$0.92 \cdot Rfil \cdot Cfil < \tau < 1.0695 \cdot Rfil \cdot Cfil \quad (9)$$

As will be understood from formulae (7), (8), and (9), the actual time constant τ falls within the range of 0.92 to 1.07 times Rfil·Cfil, i.e., the "target value of the time constant." Thus, the maximum error of the time constant is reduced from 20% to 8%, a further reduction compared with that achieved in the first embodiment (i.e., the accuracy of the time constant is further improved).

In FIG. 4, the error reference resistor R1, the resistors R32, R33, and R34, the error reference capacitor C1, and the capacitor C33 are formed by IC processes on the same semiconductor substrate. On the other hand, any other circuit elements used in the automatic time constant adjustment circuit 31 (namely, the operational amplifier OP1, the comparator CMP1, etc.) may or may not be formed by IC processes on the same semiconductor substrate on which the error reference capacitor C1 and the like are formed.

FIG. 4 shows an example in which a current V1/Rreal that is inversely proportional to the resistance Rreal of the error reference resistor R1 is passed through the error reference capacitor C1 (i.e., the error reference capacitor C1 is charged or discharged) for a predetermined length of time T, and the voltage Vc that appears as a result across the error reference capacitor C1 is compared with each of two reference voltages Vref1 and Vref2 with a view to achieving a further reduction of the maximum error in the time constant than that achieved in the first embodiment. An even further reduction of the error can be achieved by increasing the numbers of reference voltages and of comparators as necessary.

Fourth Embodiment

Figure 5:
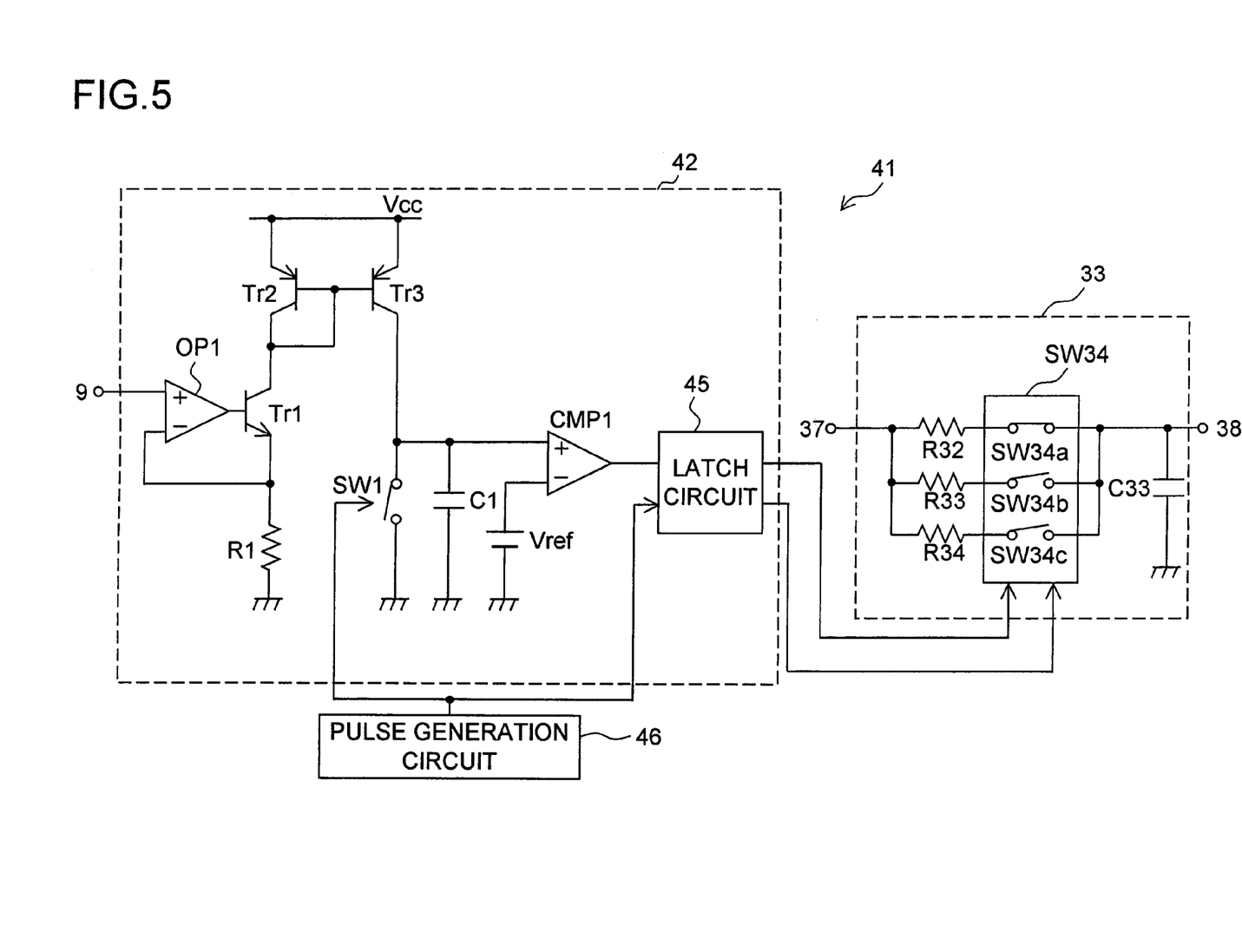
FIG. 5 is a circuit diagram of the automatic time constant adjustment circuit of a fourth embodiment of the invention.

Next, the automatic time constant adjustment circuit of a fourth embodiment of the invention will be described with reference to FIGS. 5 and 6. FIG. 5 is a circuit diagram showing the configuration of the automatic time constant adjustment circuit 41 of the fourth embodiment. The automatic time constant adjustment circuit 41 is composed of an error detection circuit 42, a variable time constant circuit 33 similar to the one shown in FIG. 4, and a pulse generation circuit 46. In FIG. 5, such circuit elements and signals as find their counterparts in FIGS. 1 and 4 are identified with common reference numerals and symbols, and their explanations will not be repeated.

In this embodiment, the error detection circuit 42 differs from the error detection circuit 2 shown in FIG. 1 in the following respects. Instead of the D flip-flop 5, a latch circuit 45 is provided. The latch circuit 45 receives the output voltage of the comparator CMP1, and the control signals A and B, which serve as the control signal from the error detection circuit 42, are fed to the variable time constant circuit 33. The switch SW1 and the latch circuit 45 are controlled by receiving the pulse voltage outputted from the pulse generation circuit 46. In other respects, the error detection circuit 42 is the same as the error detection circuit 2.

Figure 6:
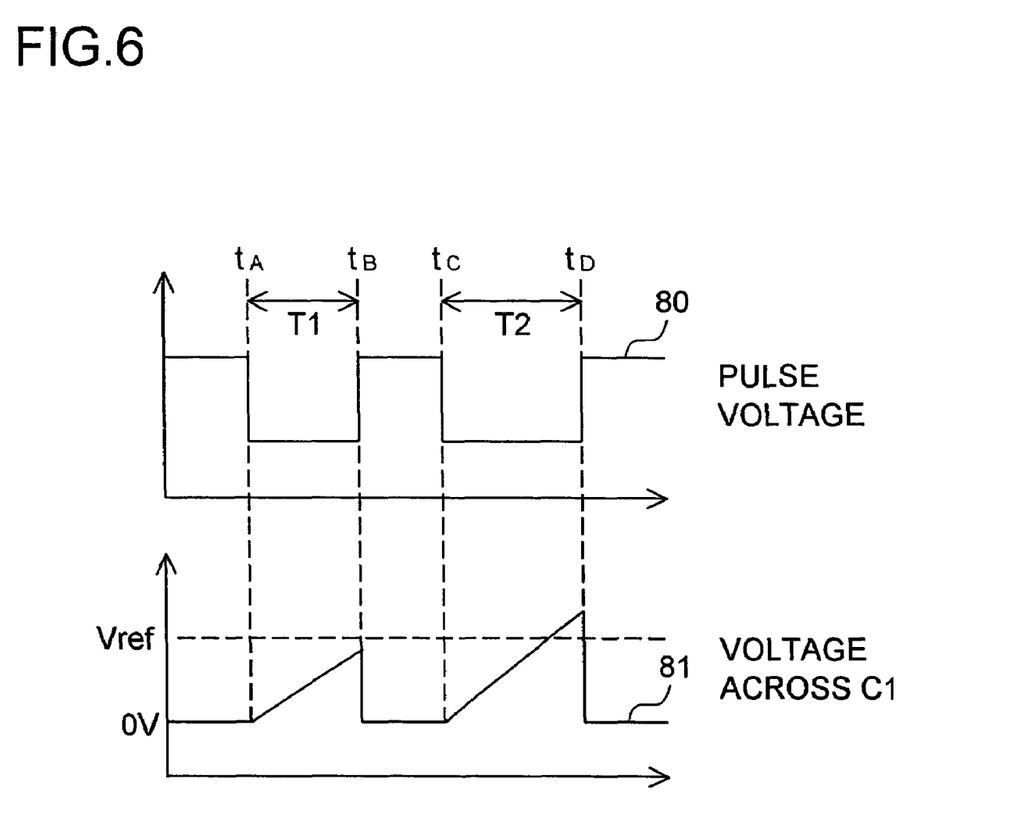
FIG. 6 is a diagram showing the voltage waveforms observed at relevant points in the automatic time constant adjustment circuit shown in FIG. 5.

FIG. 6 shows an example of the pulse voltage outputted from the pulse generation circuit 46 (indicated by line 80) and an example of the voltage appearing across the error reference capacitor C1 (indicated by line 81). In this figure, the vertical axis represents voltage, and the horizontal axis represents time. The pulse voltage turns from high to low at time points tA and tC, and turns from low to high at time points tB and tD. The length of time between the time points tA and tB is T1, and the length of time between the time points tC and tD is T2. As described earlier, when the pulse voltage is high, the switch SW1 is on, and thus the voltage appearing across the error reference capacitor C1 is 0 V; when the pulse voltage is low, the voltage appearing across the error reference capacitor C1 increases.

Let the voltage that appears across the error reference capacitor C1 at the time point tB be Vc1, and let the voltage that appears across the error reference capacitor C1 at the time point tD be Vc2. Then, formulae (10) and (11) below hold.

$$Vc1 = V1 \cdot T1/(Rreal \cdot Creal) \quad (10)$$

$$Vc2 = V1 \cdot T2/(Rreal \cdot Creal) \quad (11)$$

Here, the reference voltage Vref, the voltage V1, and the lengths of time T1 and T2 are so determined as to fulfill formulae (12) and (13) below.

$$Vref = V1 \cdot T1/(Rref \cdot Cref \cdot 0.93) \quad (12)$$

$$Vref = V1 \cdot T2/(Rref \cdot Cref \cdot 1.07) \quad (12)$$

The latch circuit 45 is so configured as to latch the outputs that the comparator CMP1 yields at the time points tB and tD and feed them, as they are and as control signals A and B, respectively, to the variable time constant circuit 33. The control signals A and B serve as the "control signals" that controls the switching operation of the switch circuit 34.

Hence, (i) when Vref>Vc2, i.e., when Rreal·Creal>Rref·Cref·1.07 holds (on the basis of formulae (11) and (13)), the outputs that the comparator CMP1 yields at the time points tB and tD are both low. Thus, the control signals A and B outputted from the latch circuit 45 are both low.

(ii) When VC1<Vref<Vc2, i.e., when Rref·Cref·0.93<Rreal·Creal<Rref·Cref·1.07 holds (on the basis of formulae (10) to (13)), the outputs that the comparator CMP1 yields at the time points tB and tD are low and high, respectively. Thus, the control signals A and B outputted from the latch circuit 45 are low and high, respectively.

(iii) When Vc1>Vref, i.e., when Rreal·Creal<Rref·Cref·0.93 holds (on the basis of formulae (10) and (12)), the outputs that the comparator CMP1 yields at the time points tB and tD are both high. Thus, the control signals A and B outputted from the latch circuit 45 are both high.

That is, a current V1/Rreal that is inversely proportional to the resistance Rreal of the error reference resistor R1 is passed through the error reference capacitor C1 (i.e., the error reference capacitor C1 is charged or discharged) for predetermined lengths of time (T1 and T2), and the voltages (Vc1 and Vc2) that appear as a result across the error reference capacitor C1 during those periods is each compared with a predetermined reference voltage Vref by the comparator CMP1. In this way, the error detection circuit 42 detects the resistance/capacitance error, which results from a variation attributable to IC processes, by finding in which of three steps it lies, and then outputs control signals corresponding to the thus found step.

The control signals A and B in this embodiment are similar to those in the third embodiment. Moreover, the variable time constant circuit 33 in this embodiment is the same as the one in the third embodiment. Thus, as in the third embodiment, the actual time constant τ falls within the range of 0.92 to 1.07 times Rfil·Cfil, i.e., the "target value of the time constant." Thus, the maximum error of the time constant is reduced from 20% to 8%, a further reduction compared with that achieved in the first embodiment (i.e., the accuracy of the time constant is further improved).

In FIG. 5, as in FIG. 4, the error reference resistor R1, the resistors R32, R33, and R34, the error reference capacitor C1, and the capacitor C33 are formed by IC processes on the same semiconductor substrate. On the other hand, any other circuit elements used in the automatic time constant adjustment circuit 41 (namely, the operational amplifier OP1, the comparator CMP1, etc.) may or may not be formed by IC processes on the same semiconductor substrate on which the error reference capacitor C1 and the like are formed.

FIG. 5 shows an example in which a current V1/Rreal that is inversely proportional to the resistance Rreal of the error reference resistor R1 is passed through the error reference capacitor C1 (i.e., the error reference capacitor C1 is charged or discharged) for predetermined lengths of time T1 and T2, and the voltages Vc1 and Vc2 that appear as a result across the error reference capacitor C1 during those periods is each compared with a reference voltage Vref with a view to achieving a further reduction of the maximum error in the time constant than that achieved in the first embodiment. An even further reduction of the error can be achieved by increasing the number of "predetermined lengths of time" as necessary.

Specifically, the current V1/Rreal is passed through the error reference capacitor C1 (i.e., the error reference capacitor C1 is charged or discharged) for a first predetermined length of time, . . . , and then for a k-th predetermined length of time, and the voltages Vc1, . . . , and Vck that appear as a result across the error reference capacitor C1 during the respective periods are each compared with the reference voltage Vref. Here, the value of k is set equal to a natural number equal to or greater than three.

Possible Modifications and Variations

The specific design resistances and capacitances of the resistors and capacitors included in the variable time constant circuit 3, 23, and 33 (hereinafter also referred to collectively as the "variable time constant circuit") (for example 0.9·Rfil as the design resistance of the resistor R2) and the specific values used in formulae (5), (6), (12), and (13) (for example, 0.93 in formula (5)) are determined in such a way that "the maximum error that can arise between the predetermined target value (Rfil·Cfil) of the time constant of the variable time constant circuit and the actually set time constant $\tau$ (for example, in the case of the first embodiment, 1−0.88=0.12, hence 12%) is smaller than the maximum value of the resistance/capacitance error that can be produced by IC processes (i.e., the maximum error, about 20%)" (in other words, in such a way that "the accuracy of the time constant $\tau$ is improved). It should therefore be understood that these specific values are not meant to limit the scope of the present invention in any way.

Here, "the maximum value of the resistance/capacitance error that can be produced by IC processes (i.e., the maximum error)" depends on the characteristics and the like of the semiconductor substrate and IC processes on and by which resistors etc. are formed. The maximum value of the resistance/capacitance error is assumed to be, not "about ±20%" or the like, but equal to a specific value (for example, −20% to +20%), and then the design resistance and capacitance of the resistor (such as the resistor R2) and capacitor (such as the capacitor C3) included in the variable time constant circuit are determined in such a way that the actual time constant $\tau$ becomes closer to the target value (Rfil·Cfil). Thus, the maximum value of the resistance/capacitance error can be considered to be equal to a specific value (for example, −20% to +20%) that is previously determined to suit the characteristics and the like of a particular semiconductor substrate and IC processes.

It is, however, also possible to allow for a certain width, like "about ±20%," in the maximum value of the resistance/capacitance error when determining the design resistance and capacitance of the resistor (such as the resistor R2) and capacitor (such as the capacitor C3) included in the variable time constant circuit are determined in such a way that the actual time constant $\tau$ becomes closer to the target value (Rfil·Cfil).

Any two or more of the embodiments described above can be combined together so long as they do not conflict with each other. The embodiments described above all deal with examples involving a first-order LPF or HPF. This, however, is not meant to limit the application of the present invention in any way. That is, the present invention can be applied to any circuits including a resistor-capacitor serial circuit, such as any types of nth-order (where n is a natural number) filter circuit (such as LPFs, HPFs, band-eliminate filters, band-pass filters, and all-pass filters) and delay circuits.

The embodiments described above all deal with examples in which, to simplify the description, the variable time constant circuit includes a single first-order LPF or HPF. It is, however, possible to improve accuracy by applying any of the configurations described above to any resistor-capacitor serial circuit that is formed on the same semiconductor substrate on which an error reference resistor and an error reference capacitor are formed.

Resistance/capacitance Error

In all the embodiments described above, the "resistance/capacitance error" is described as referring to "Rreal·Creal−Rref·Cref." The "resistance/capacitance error," however, may be any value calculated on the basis of "Rreal·Creal−Rref·Cref." For example, a value calculated by adding some value to "Rreal·Creal−Rref·Cref" or by multiplying it with some value may be dealt with as the "resistance/capacitance error."

One-shot Pulse From the Pulse Generation Circuit

The pulse generation circuit 6 is described as outputting a pulse voltage "of which the period of a single pulse equals twice the length of time T and of which the duty factor is 50%." The pulse generation circuit 6, however, may output a plurality of pulses continuously or a particular number of pulses.

The Present Invention Put Otherwise

Put otherwise, an automatic time constant adjustment circuit according to the present invention can be described as follows: an automatic time constant adjustment circuit is provided with: an error detection circuit including an error reference resistor and an error reference capacitor formed, each by an IC process, on the same semiconductor substrate, the error detection circuit detecting, based on the resistance of the error reference resistor and the capacitance of the error reference capacitor, a resistance/capacitance error resulting from a variation attributable to an IC process, the error detection circuit then outputting a control signal corresponding to the resistance/capacitance error; and a variable time constant circuit including a resistance portion, a capacitance portion, and a switch portion, the resistance portion being build with one or more resistors formed by an IC process on the semiconductor substrate, the capacitance portion being build with one or more capacitors formed by an IC process on the semiconductor substrate, the switch portion being connected between the resistor portion and the capacitor portion, the switch portion setting the time constant of the variable time constant circuit according to the resistance/capacitance error by connecting together one of the resistors of the resistor portion and one of the capacitors of the capacitor portion according to the control signal. Here, at least either the number of resistors provided as the resistors or the number of capacitors provided as the capacitors is two or more.

The error detection circuit passes a current inversely proportional to the resistance of the error reference resistor through the error reference capacitor for a predetermined period and compares the voltage appearing as a result across the error reference capacitor with a predetermined reference voltage so as to detect the resistance/capacitance error, which corresponds to the value obtained by subtracting from the product of the resistance of the error reference resistor and the capacitance of the error reference capacitance the product of the design resistance of the error reference resistor and the design capacitance of the error reference capacitor, by finding in which of n steps (where n is a natural number equal to or greater than 2) the resistance/capacitance error lies, the error detection circuit then outputting the control signal corresponding to the step in which the resistance/capacitance error is found to lie. The time constant of the variable time constant circuit can be set at one of n time constants according to in which of the n steps the resistance/capacitance error is found to lie. The variable time constant circuit is so configured that, through connecting operation performed by the switch portion, appropriate ones of the resistors of the resistor portion and of the capacitors of the capacitor portion are connected together either in such a way that the design value of the time constant is smaller than a predetermined target value of the time constant or in such a way that the design value of the time constant is greater than the predetermined target value of the time constant (the design resistances of the resistors of the resistor portion and the design capacitances of the capacitors of the capacitor portion are so determined and the switch portion is so configured that the switch portion can perform such connecting operation). The switch portion sets the time constant by connecting together, when receiving a control signal corresponding to the resistance/capacitance error being positive, appropriate ones of the resistors of the resistor portion and of the capacitors of the capacitor portion such that the design value of the time constant is smaller than the predetermined target value of the time constant and connecting together, when receiving a control signal corresponding to the resistance/capacitance error being negative, appropriate ones of the resistors of the resistor portion and of the capacitors of the capacitor portion such that the design value of the time constant is greater than the predetermined target value of the time constant.

What is claimed is:

1. An automatic time constant adjustment circuit comprising:

an error detection circuit including an error reference resistor and an error reference capacitor formed, each by an IC process, on a single semiconductor substrate, the error detection circuit passing a current inversely proportional to a resistance of the error reference resistor through the error reference capacitor for a predetermined period and comparing a voltage appearing as a result across the error reference capacitor with a predetermined reference voltage so as to detect a resistance/capacitance error, which corresponds to a value obtained by subtracting from a product of the resistance of the error reference resistor and a capacitance of the error reference capacitance a product of a design resistance of the error reference resistor and a design capacitance of the error reference capacitor, by finding in which of n steps (where n is a natural number equal to or greater than 2) the resistance/capacitance error lies, the error detection circuit then outputting a control signal corresponding to the step in which the resistance/capacitance error is found to lie; and a variable time constant circuit including a resistance portion, a capacitance portion, and a switch portion, the resistance portion being formed with one or more resistors formed by an IC process on the semiconductor substrate, the capacitance portion being formed with one or more capacitors formed by an IC process on the semiconductor substrate, the switch portion being connected between the resistor portion and the capacitor portion, the switch portion setting a time constant of the variable time constant circuit according to the resistance/capacitance error by connecting together one of the resistors of the resistor portion and one of the capacitors of the capacitor portion according to the control signal, wherein at least either a number of resistors provided as the resistors or a number of capacitors provided as the capacitors is two or more.

2. The automatic time constant adjustment circuit of claim 1, wherein design resistances of the resistors of the resistor portion and design capacitances of the capacitors of the capacitor portion are determined and the switch portion connects together appropriate ones of the resistors of the resistor portion and of the capacitors of the capacitor portion such that a maximum error arising between the actually set time constant and a predetermined target value of the time constant is smaller than a particular maximum value of the resistance/capacitance error attributable to an IC process.

3. The automatic time constant adjustment circuit of claim 1, wherein the error detection circuit passes a current inversely proportional to the resistance of the error reference resistor through the error reference capacitor for a predetermined period and compares a voltage appearing as a result across the error reference capacitor with a predetermined reference voltage so as to detect the resistance/capacitance error by finding in which of n steps (where n is a natural number equal to or greater than 2) the resistance/capacitance error lies, the error detection circuit then outputting the control signal corresponding to the step in which the resistance/capacitance error is found to lie, wherein the time constant of the variable time constant circuit can be set at one of n time constants according to in which of the n steps the resistance/capacitance error is found to lie.

4. The automatic time constant adjustment circuit of claim 3, wherein n is a natural number equal to or greater than 3 and the reference voltage includes a plurality of reference voltages having different voltage levels, wherein the error detection circuit compares the voltage appearing across the error reference capacitor with each of the plurality of reference voltages to output the control signal.

5. The automatic time constant adjustment circuit of claim 1, wherein the error detection circuit passes a current inversely proportional to the resistance of the error reference resistor through the error reference capacitor for a first predetermined period, . . . , and for a k-th predetermined period (where k is a natural number equal to or greater than 2) and compares a voltage appearing as a result across the error reference capacitor during each of those periods with a predetermined reference voltage so as to detect the resistance/capacitance error by finding in which of (k+1) steps the resistance/capacitance error lies, the error detection circuit then outputting the control signal corresponding to the step in which the resistance/capacitance error is found to lie, wherein the time constant of the variable time constant circuit can be set at one of (k+1) time constants according to in which of the (k+1) steps the resistance/capacitance error is found to lie.

6. The automatic time constant adjustment circuit of claim 1, wherein the error detection circuit passes a current inversely proportional to the resistance of the error reference resistor through the error reference capacitor for a predetermined period and compares a voltage appearing as a result across the error reference capacitor with a predetermined reference voltage so as to detect the resistance/capacitance error, which corresponds to a value obtained by subtracting from a product of the resistance of the error reference resistor and the capacitance of the error reference capacitance a product of a design resistance of the error reference resistor and a design capacitance of the error reference capacitor, by finding in which of n steps (where n is a natural number equal to or greater than 2) the resistance/capacitance error lies, the error detection circuit then outputting the control signal corresponding to the step in which the resistance/capacitance error is found to lie, wherein the time constant of the variable time constant circuit can be set at one of n time constants according to in which of the n steps the resistance/capacitance error is found to lie, wherein the switch portion sets the time constant by connecting together, when receiving a control signal corresponding to the resistance/capacitance error being positive, appropriate ones of the resistors of the resistor portion and of the capacitors of the capacitor portion such that a design value of the time constant is smaller than a predetermined target value of the time constant and connecting together, when receiving a control signal corresponding to the resistance/capacitance error being negative, appropriate ones of the resistors of the resistor portion and of the capacitors of the capacitor portion such that the design value of the time constant is greater than the predetermined target value of the time constant.

7. The automatic time constant adjustment circuit of claim 2, wherein the error detection circuit passes a current inversely proportional to the resistance of the error reference resistor through the error reference capacitor for a predetermined period and compares a voltage appearing as a result across the error reference capacitor with a predetermined reference voltage so as to detect the resistance/capacitance error by finding in which of n steps (where n is a natural number equal to or greater than 2) the resistance/capacitance error lies, the error detection circuit then outputting the control signal corresponding to the step in which the resistance/capacitance error is found to lie, wherein the time constant of the variable time constant circuit can be set at one of n time constants according to in which of the n steps the resistance/capacitance error is found to lie.

8. The automatic time constant adjustment circuit of claim 7, wherein n is a natural number equal to or greater than 3 and the reference voltage includes a plurality of reference voltages having different voltage levels, wherein the error detection circuit compares the voltage appearing across the error reference capacitor with each of the plurality of reference voltages to output the control signal.

9. The automatic time constant adjustment circuit of claim 2, wherein the error detection circuit passes a current inversely proportional to the resistance of the error reference resistor through the error reference capacitor for a first predetermined period, . . . , and for a k-th predetermined period (where k is a natural number equal to or greater than 2) and compares a voltage appearing as a result across the error reference capacitor during each of those periods with a predetermined reference voltage so as to detect the resistance/capacitance error by finding in which of (k+1) steps the resistance/capacitance error lies, the error detection circuit then outputting the control signal corresponding to the step in which the resistance/capacitance error is found to lie, wherein the time constant of the variable time constant circuit can be set at one of (k+1) time constants according to in which of the (k+1) steps the resistance/capacitance error is found to lie.

10. The automatic time constant adjustment circuit of claim 2, wherein the error detection circuit passes a current inversely proportional to the resistance of the error reference resistor through the error reference capacitor for a predetermined period and compares a voltage appearing as a result across the error reference capacitor with a predetermined reference voltage so as to detect the resistance/capacitance error, which corresponds to a value obtained by subtracting from a product of the resistance of the error reference resistor and the capacitance of the error reference capacitance a product of a design resistance of the error reference resistor and a design capacitance of the error reference capacitor, by finding in which of n steps (where n is a natural number equal to or greater than 2) the resistance/capacitance error lies, the error detection circuit then outputting the control signal corresponding to the step in which the resistance/capacitance error is found to lie, wherein the time constant of the variable time constant circuit can be set at one of n time constants according to in which of the n steps the resistance/capacitance error is found to lie, wherein the switch portion sets the time constant by connecting together, when receiving a control signal corresponding to the resistance/capacitance error being positive, appropriate ones of the resistors of the resistor portion and of the capacitors of the capacitor portion such that a design value of the time constant is smaller than a predetermined target value of the time constant and connecting together, when receiving a control signal corresponding to the resistance/capacitance error being negative, appropriate ones of the resistors of the resistor portion and of the capacitors of the capacitor portion such that the design value of the time constant is greater than the predetermined target value of the time constant.

* * * * *